United States Patent
Kuhmann et al.

(10) Patent No.: US 7,419,853 B2
(45) Date of Patent: Sep. 2, 2008

(54) METHOD OF FABRICATION FOR CHIP SCALE PACKAGE FOR A MICRO COMPONENT

(75) Inventors: Jochen Kuhmann, Berlin (DE); Matthias Heschel, Rodovre (DK)

(73) Assignee: Hymite A/S, Kgs. Lyngby (DK)

( * ) Notice: Subject to any disclaimer, the term of this patent is extended or adjusted under 35 U.S.C. 154(b) by 213 days.

(21) Appl. No.: 11/202,478

(22) Filed: Aug. 11, 2005

(65) Prior Publication Data

US 2007/0035001 A1    Feb. 15, 2007

(51) Int. Cl.
 *H01L 29/74* (2006.01)
(52) U.S. Cl. .................. 438/113; 257/E21.596
(58) Field of Classification Search .......... 438/33, 438/68, 113, 114, 458; 257/E21.596, E21.599
See application file for complete search history.

(56) References Cited

U.S. PATENT DOCUMENTS 6,939,784 B2 * 9/2005 Chen et al. ............ 438/456
2005/0054133 A1  3/2005 Felton et al.

FOREIGN PATENT DOCUMENTS

DE  102 58 478 A1  7/2004
EP  1 096 259 A  5/2001

OTHER PUBLICATIONS

Felton et al., "Chip Scale Packaging of a MEMS Accelerometer," IEEE, Electronic Components and Technology Conference, pp. 869-873, 2004.
Yun et al., "Wafer-Level Packaging of MEMS Accelerometers with Through-Wafer Interconnects," IEEE, Electronic Components and Technology Conference, pp. 320-323, 2005.

* cited by examiner

*Primary Examiner*—Howard Weiss
*Assistant Examiner*—Hoa B Trinh
(74) *Attorney, Agent, or Firm*—Fish & Richardson P.C.

(57) ABSTRACT

A package includes a sensor die with a micro component, such as a MEMS device, coupled to an integrated circuit which may include, for example, CMOS circuitry, and one or more electrically conductive bond pads near the periphery of the sensor die. A semiconductor cap structure is attached to the sensor die. The front side of the cap structure is attached to the sensor die by a seal ring to hermetically encapsulate an area of the sensor die where the micro component is located. The bond pads on the sensor die are located outside the area encapsulated by the seal ring. Electrical leads, which extend along outer side edges of the semiconductor cap structure from its front side to its back side, are coupled to the micro component via the bond pads.

6 Claims, 4 Drawing Sheets

METHOD OF FABRICATION FOR CHIP SCALE PACKAGE FOR A MICRO COMPONENT

TECHNICAL FIELD

This disclosure relates to a chip scale package for a micro component, such as a Micro Electro Mechanical Systems (MEMS) device.

BACKGROUND

Proper packaging of micro components is important to ensure the integrity of the signals to and from the micro components and often determines the overall cost and size of the assembly.

For example, MEMS devices, such as accelerometers and other inertial sensors, have found applications in various consumer products including laptop computers, cell phones and handheld computers. In some applications, the MEMS device is fabricated on the same die as the signal process circuitry. For example, BiCMOS circuit fabrication processes may be integrated with a surface micromachined MEMS process. Integrating the micro component with the circuitry can facilitate signal amplification and signal processing.

The overall process of manufacturing a package that encapsulates such an integrated MEMS device may include the following steps: (i) fabrication of an integrated MEMS device; (ii) a wafer capping process for the MEMS device; and (iii) assembly of the capped MEMS device in the package. One advantage of capping the MEMS device prior to assembly is that it can reduce the complexity of the subsequent dicing operation. Another advantage is that the cap can protect the MEMS device when the die is attached, for example, to a lead frame. A schematic cross-section of a package for a capped sensor die that includes a MEMS device is illustrated in FIG. 1 and is described in further detail in Felton et al., "Chip Scale Packaging of a MEMS Accelerometer," 2004 *Electronic Components and Technology Conference*, IEEE, pp. 869-873 (2004).

An important factor for handheld consumer products such as those mentioned above is the size and weight of the package. Although the techniques described in the foregoing article apparently result in a relatively small package, they require the use of wire bonding for the electrical connections between the lead frame and the die for the MEMS device. The overall footprint of the package, including the electrical connections to the lead frame, is larger than the footprint of the sensor die. For some applications, it may be desirable to have a smaller footprint.

SUMMARY

In one aspect, a package includes a sensor die that includes a micro component coupled to an integrated circuit, and one or more electrically conductive bond pads near the periphery of the sensor die. A semiconductor cap structure is attached to the sensor die. The front side of the cap structure is attached to the sensor die by a seal ring to hermetically encapsulate an area of the sensor die where the micro component is located. The bond pads on the sensor die are located outside the area encapsulated by the seal ring. Electrical leads, which extend along outer side edges of the semiconductor cap structure from its front side to its back side, are coupled to the micro component via the bond pads.

One or more of the following features may be present in some implementations. For example, in a particular implementation, the micro component comprises a MEMS device, and the integrated circuit comprises CMOS circuitry. The invention also may used in connection with other micro components and other types of circuitry.

The electrical leads may be coupled to electrically conductive pads on the back side of the cap structure. The outer side edges of the cap structure along which the electrical leads extend may be sloped to facilitate deposition of the metal for the leads. The electrically conductive pads on the back side of the cap structure may be adapted for surface mounting, for example, on a printed circuit board.

A method for fabricating a package according to the invention also is disclosed.

One or more of the following advantages may be present in some implementations. The disclosure can facilitate hermetically sealing a micro component in a package while providing external leads for connection to the micro component. A package according to the present invention may be attached to a printed circuit board by surface mounted technologies (SMT). Thus, the present invention may result in a relatively small overall footprint for the package.

The details of one or more embodiments of the invention are set forth in the accompanying drawings and the description below. Other features and advantages of the invention may be apparent from the description, the accompanying drawings, and the claims.

BRIEF DESCRIPTION OF THE DRAWINGS

Like reference symbols in the various drawings indicate like elements.

DETAILED DESCRIPTION

Figure 2:
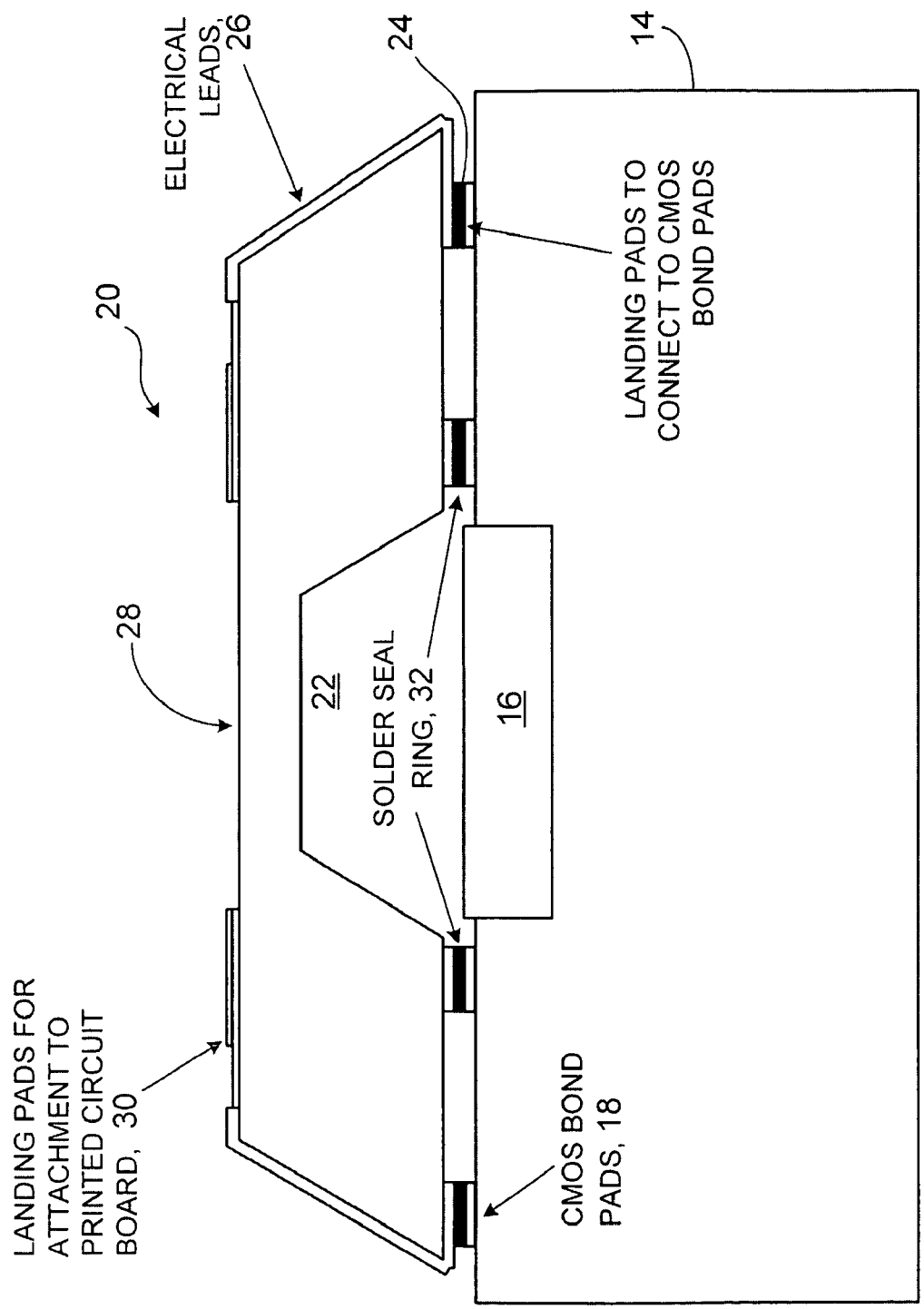
FIG. 2 is a schematic cross-section of a package for a capped sensor die according to the present invention.
Figure 3:
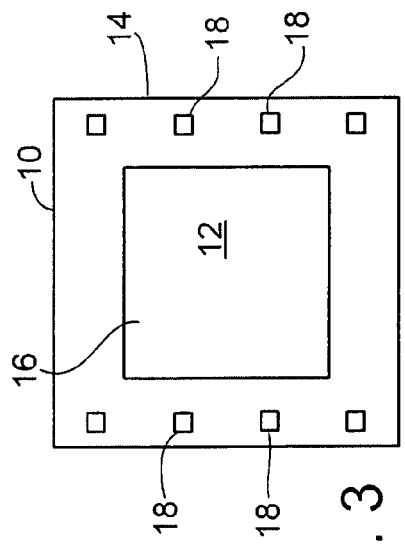
FIG. 3 illustrates an example of a sensor die for use in accordance with the present invention.

FIG. 2 illustrates an example of a die 14 that includes a CMOS sensor integrated circuit and a MEMS device, for example, an accelerometer, gyroscope or other inertial sensor. Other types of MEMS devices may be integrated with the circuit as well. As shown in FIG. 3, the MEMS device 12 is fabricated on the same die 14 as the CMOS integrated circuit 10. In the illustrated example, the MEMS device 12 is formed on an inner area 16 of the die 14, and bond pads 18 near the periphery of the die 14 provide electrical connections to and from the die 14. In the illustrated example, the die 14 is symmetrical in the sense that the MEMS device is located substantially at the center of the die. However, in other implementations, the MEMS device may be offset from the center of the die. Buried or on-chip interconnections may be used to couple the MEMS device 12 and the CMOS integrated circuit 10. Other details of the CMOS integrated circuit are not required for an understanding of the invention and, therefore, are not discussed further.

Although the particular example discussed here includes a MEMS device and CMOS circuitry, the invention is not limited to those applications. More generally, the techniques described here also may be used with micro components other than MEMS devices and with circuitry other than CMOS. As used in this disclosure, the phrase "micro components" includes optical devices, electro-magnetic devices, chemical devices, micro-mechanical devices, micro-electro-mechanical system (MEMS) devices or micro-optoelectro-mechanical system (MOEMS) devices or other devices that contain tiny, micron and sub-micron-sized elements.

As shown in FIG. 2, a cap structure 20, which may comprise silicon, covers part of the die 14 so as to encapsulate the sensor area 16 where the MEMS device 12 is formed. The cap structure 20 has a cavity 22 on its underside facing the sensor area 16 so as to provide head-room for the MEMS device. Landing pads 24 (e.g., solder pads) on the front side of the cap structure 20 are electrically connected to electrical leads 26 that extend along the sides of the cap structure 20 that slope from its back side 28 to its front side. The electrical leads 26 on the back side of the cap structure 20 may be connected, for example, to a printed circuit board or other platform (not shown in FIG. 2) through landing pads 30 (e.g., solder pads).

The cap structure 20 may be attached to the die 14, for example, by a solder seal ring 32, so as to seal the MEMS device 12 hermetically within the encapsulated area. The bond pads 18 on the sensor die 14 remain outside the area hermetically encapsulated by the seal ring 32 so that they may be connected to the landing pads 24 on the front side of the cap structure 20. The seal ring 32 need not be circular shaped, but may have other shapes as well. Thermo-compression bonding or other techniques may be used to attach the cap structure 20 to the die 14.

Figure 5:
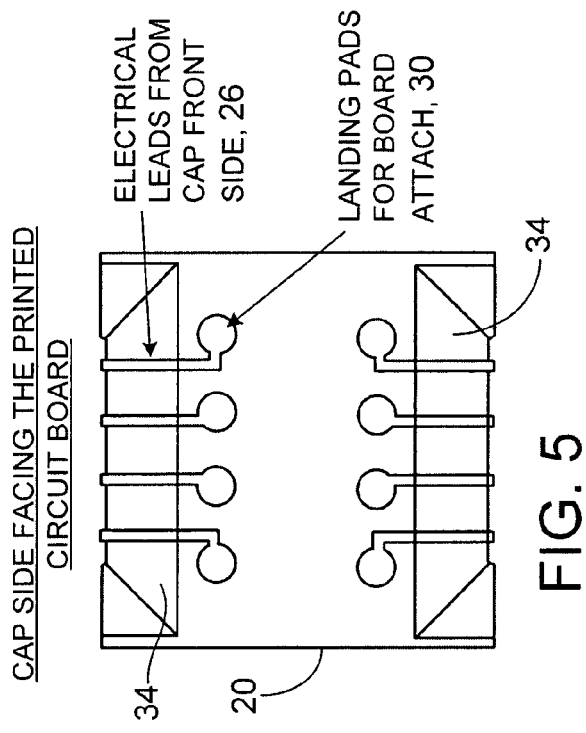
FIG. 5 illustrates the back side of a cap structure according to the invention.
Figure 4:
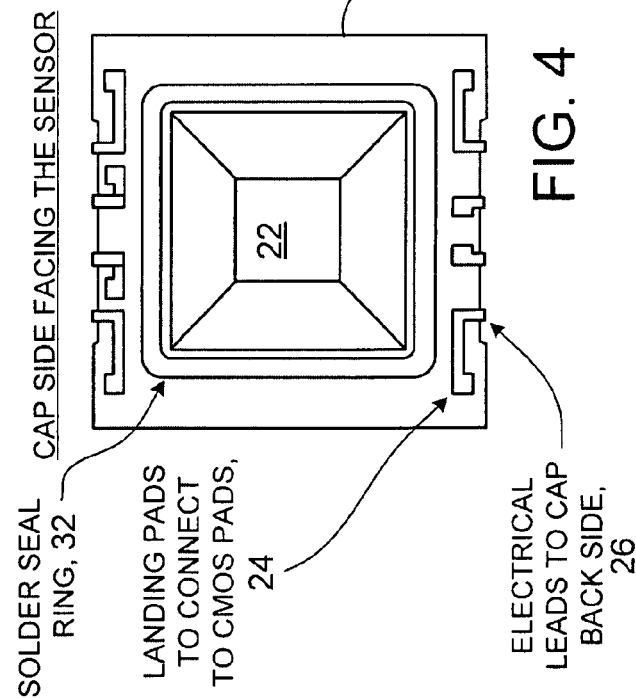
FIG. 4 illustrates the front side of a cap structure according to the invention.

FIGS. 4 and 5 illustrate the front side and back side, respectively, of the cap structure 20 for the particular example of FIG. 2. In particular, FIG. 4 shows an example of the front side of the cap structure including the cavity 22, the seal ring 32, the landing pads 24 and electrical leads 26. FIG. 5 illustrates an example of the back side of the cap structure 20 including the electrical leads 26, and landing pads 30 for attachment to a printed circuit board. The precise layout and number of the landing pads and electrical leads may vary in other implementations. However, the landing pads 24 on the front side of the cap structure 20 should be positioned so that they are aligned with the bond pads 18 near the periphery of the die 14 (see FIG. 3) when the cap structure is attached to the die.

As will be evident from the illustrated example, the footprint of the resulting package is determined by the size of the die 14, not by the cap structure 20. Therefore, the addition of the cap structure 20 to encapsulate the MEMS device 12 on the sensor area 16 need not enlarge the footprint of the overall package, as may occur with other capping structures.

An example of a technique for fabricating packages that include a cap structure 20 is discussed in the following paragraphs.

Initially, a silicon wafer may be micro-machined so that deep cavities, like the cavity 22 (FIG. 1), are etched from one side (e.g., the front side) of the wafer. Slot-like through-holes are etched from the opposite side (i.e., the back side) of the silicon wafer. The through-holes are formed adjacent the location of the cavities. During a later fabrication stage (i.e., dicing), the individual packages are separated from one another along the middle of the through-holes. Portions of two through-holes 34 can be seen on either side of the cap structure 20 in FIG. 5. Standard etching techniques may be used to form the cavities 22 and the through-holes 34 and result in the sloping side edges of the cap structure as shown in FIG. 2.

The wafer may be passivated electrically, for example, by a thermal oxidation process. A thin-film metallization is deposited on the front and back sides of the wafer. The thin film metallization may include, for example, aluminum (Al), titanium (Ti), nickel (Ni) and gold (Au), with gold as the upper-most layer. The metallization forms the landing pads 30 for attachment to the printed circuit board. In this example, metallization between the pads 30 and the through-hole metallization for the electrical leads 26 includes only aluminum and titanium. In those regions, the upper layers of nickel and gold are removed.

In some implementations, an electro-depositable photoresist is deposited electrochemically and substantially uniformly over the surface of the wafer and is patterned lithographically. The patterned photoresist forms the mold for the electrical leads 26.

In a particular implementation, the through-hole metallization includes, for example, six microns (µm) gold or copper (Cu), and two microns tin (Sn). That metallization is electrochemically deposited into the resist mold to form multiple interconnects via the through-holes. The resist mold then is stripped.

Two subsequent lithography (e.g., electro-depositable photoresist) and etching steps define the landing pads for attachment to the printed circuit board and the non-solderable region between the bond pads and the feed-through metallization.

The wafer that includes the cap structures 20 is bonded to the wafer that includes the CMOS sensor integrated circuit dies, for example, by a reflow process. The solder for attachment to the printed circuit board may be deposited, for example, by screen printing. The encapsulated dies then are separated by dicing through the middle of the through-holes to form the individual packages.

Figure 1:
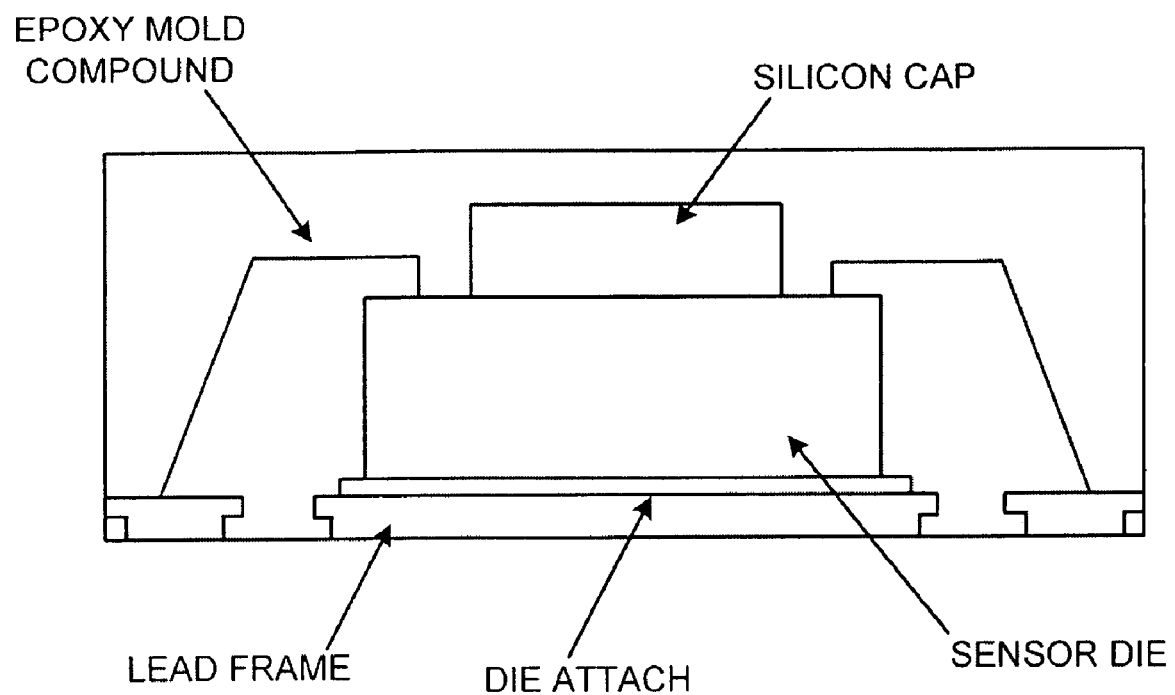
FIG. 1 is a schematic cross-section of a known package for a capped sensor die.
Figure 6:
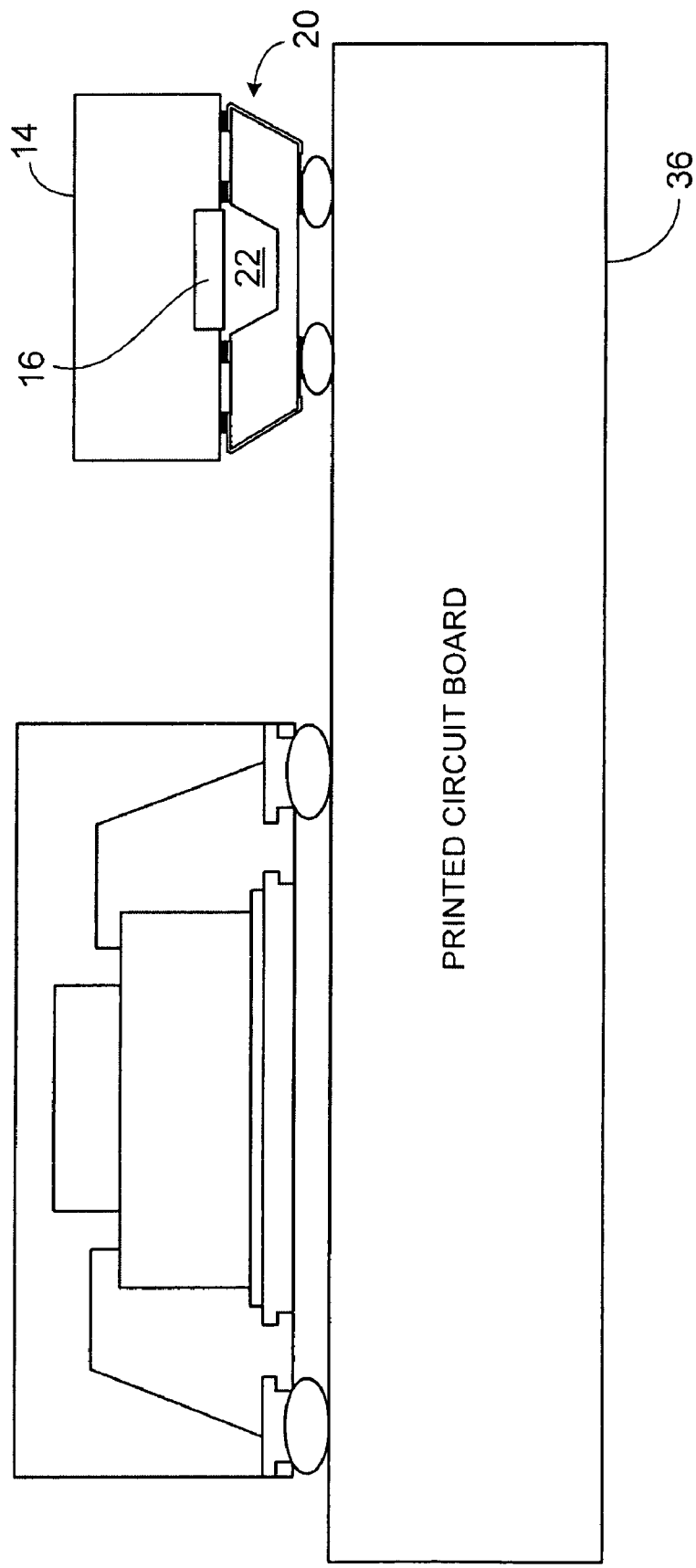
FIG. 6 illustrates the packages of FIGS. 1 and 2 attached to a printed circuit board.

FIG. 6 illustrates the packages of FIGS. 1 and 2 attached to a printed circuit board 36. Both packages are shown with sensor dies of the same size. As is evident from FIG. 6, using the cap structure 20 of the present invention may result in a smaller overall footprint for the package. Because a package according to the present invention can be attached to a printed circuit board by surface mounted technologies (SMT), the size of the sensor die 14, rather than the cap structure or electrical connections, determines the footprint of the package.

A number of embodiments of the invention have been described. Nevertheless, it will be understood that various modifications may be made without departing from the spirit and scope of the invention. Accordingly, other implementations are within the scope of the following claims.

What is claimed is:

1. A method comprising:

providing a semiconductor wafer with a structure that includes (i) a cavity in a first side of the wafer, (ii) electrical leads extending from the first side of the semiconductor wafer to a second side that is opposite the first side, wherein the electrical leads extend through through-holes in the semiconductor wafer, and wherein the through-holes are positioned away from the cavity, (iii) electrically conductive pads on the first side of the semiconductor wafer, wherein the electrically conductive pads are connected to the electrical leads, and (iv) a seal ring on the first side of the semiconductor wafer;

attaching the semiconductor wafer to a second wafer comprising a sensor die that includes a micro component, an integrated circuit, and electrically conductive bond pads near the periphery of the sensor die, such that the micro component is hermetically encapsulated within an area defined by the seal ring, and the electrically conductive pads on the first side of the semiconductor wafer are electrically connected to the bond pads near the periphery of the sensor die; and dicing the semiconductor wafer along the through-holes to obtain an individual package comprising the hermetically sealed micro component.

2. The method of claim 1 including:

etching the semiconductor wafer from the first side to form the cavity; and etching the semiconductor wafer from the second side to form the through-holes.

3. The method of claim 2 including:

providing feed-through metallization in the through-holes to form the electrical leads.

4. The method of claim 1 wherein the micro component comprises a MEMS device, and the integrated circuit comprises CMOS circuitry.

5. The method of claim 1 including surface mounting the package.

6. The method of claim 1 wherein, when the semiconductor wafer is attached to the wafer with the sensor die, the electrically conductive pads on the first side of the semiconductor wafer and the bond pads near the periphery of the sensor die are located outside the area defined by the seal ring within which the micro component is hermetically sealed.

* * * * *